United States Patent [19]

Lendaro

[11] Patent Number: 4,769,705

[45] Date of Patent: Sep. 6, 1988

[54] DEFLECTION SYNCHRONIZING APPARATUS

[75] Inventor: Jeffery B. Lendaro, Noblesville, Ind.

[73] Assignee: RCA Licensing Corporation, Princeton, N.J.

[21] Appl. No.: 68,085

[22] Filed: Jun. 30, 1987

[51] Int. Cl.[4] .............................................. H04N 5/04
[52] U.S. Cl. .................................... 358/158; 358/148; 358/159
[58] Field of Search ............... 358/148, 149, 150, 152, 358/153, 154, 158, 159; 375/120

[56] References Cited

U.S. PATENT DOCUMENTS

| | | | |
|---|---|---|---|
| 4,198,659 | 4/1980 | Iijima et al. | 358/153 |
| 4,317,133 | 2/1982 | Fernsler et al. | 358/158 |
| 4,327,376 | 4/1982 | Balaban et al. | 358/159 |
| 4,351,001 | 9/1982 | McGinn et al. | 358/158 |
| 4,396,948 | 8/1983 | Fernsler et al. | 358/158 |
| 4,647,970 | 3/1987 | Sumiyoshi | 358/159 |

OTHER PUBLICATIONS

A technical data publication for a Bipolar Linear Integrated Circuit (IC) Silicon Monolithic TA7777P that is made by Toshiba Corp. Japan.

U.S. patent application Ser. No. 068,084, entitled A Television Fault Protection Apparatus, in the names of James Harrison Doty, et al., that was filed 6/30/87.

Primary Examiner—James J. Groody
Assistant Examiner—Michael D. Parker
Attorney, Agent, or Firm—Eugene M. Whitacre; Joseph J. Laks; Sammy S. Henig

[57] ABSTRACT

A phase-lock-loop circuit of a television deflection apparatus generates a first signal at the horizontal frequency and a second signal at 32 times the horizontal frequency that are both synchronized to a horizontal sync signal. A frequency divider that is outside the phase-lock-loop circuit generates from the second signal a third signal at the horizontal frequency. The frequency divider is synchronized by the first signal to cause the third signal to be in a constant phase relationship relative to that of the first signal. The third signal is used by a phase-control-loop to control the phase of the deflection current.

17 Claims, 1 Drawing Sheet

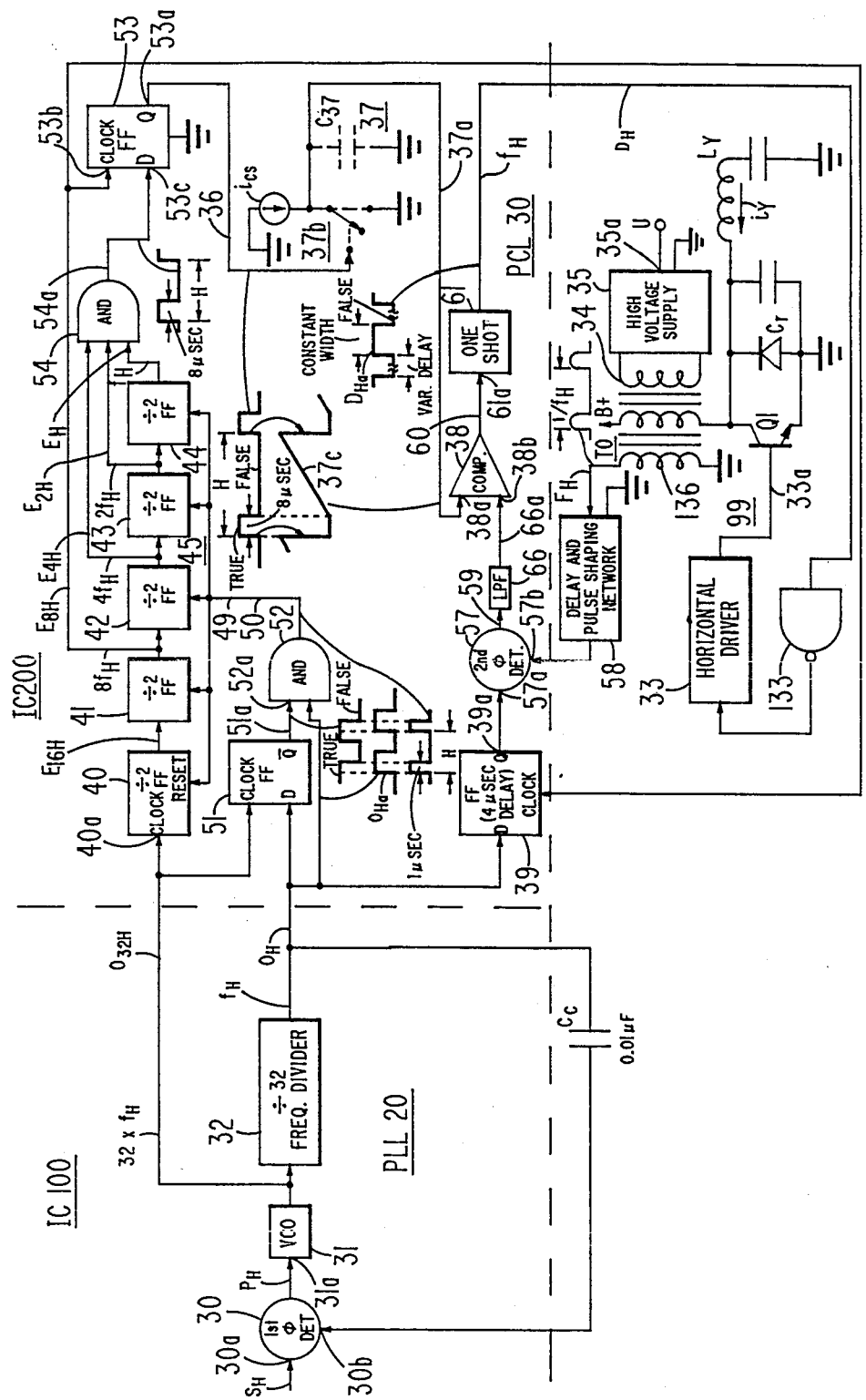

DEFLECTION SYNCHRONIZING APPARATUS

This invention relates to a deflection synchronizing arrangement of a television apparatus.

Television displays of television signals are generated by repetitively scanning an electron beam over the surface of a picture tube viewing screen. The beam intensity is modulated by video signals to form images on the screen representative of the picture to be displayed. In order to synchronize the scanning of the beam with the display information, the scanning or deflection circuits are synchronized with a synchronizing signal combined with the image information in a composite video signal. As received, the synchronizing signal may contain distortions in the form of electrical noise.

As transmitted, the synchronizing signal pulses recur at a rate which is stable. Because of the presence of noise it has become common practice to obtain synchronization of the horizontal deflection circuit with the horizontal synchronizing signal pulses by the use of an oscillator. The oscillator is controlled by and is included in a phase-lock loop (PLL). The oscillator generates a signal at a frequency that is equal to, for example, a high multiple of the synchronizing signal frequency $f_H$. Because of the PLL operation, when, for example, one synchronizing pulse is obscured by noise, the rate of the oscillator, nevertheless, remains substantially unchanged, and the deflection circuits continue to receive regular deflection control pulses.

It may be desirable, for purposes of stability of the PLL, to use an oscillator operating at a frequency that is greater than $f_H$ that is then followed by a frequency divider arrangement that produces from a signal of the oscillator a horizontal-rate output signal with high stability. The horizontal rate output signal may be locked by the PLL to the average phase of the incoming synchronizing signal.

Such PLL is internal to, for example, an integrated circuit (IC) TA 7777 that is made by Toshiba Co. (the Toshiba IC). The Toshiba IC or other similar integrated circuits produces, at a corresponding pair of output terminals, a first output signal at the horizontal frequency $f_H$ and a second output signal at a frequency that is 32 times the horizontal frequency $f_H$, respectively. The first output signal may be used in a television receiver to produce the horizontal rate deflection current.

In the normal operation of a television receiver, a horizontal deflection circuit output stage produces high-voltage retrace pulses. It is customary to derive a high ultor voltage required for operation of a kinescope of the receiver by rectifying and filtering the high-voltage pulses.

The timings of a deflection current in a deflection winding and of the retrace pulses produced by the horizontal deflection circuit output stage may vary in a manner dependent upon loading of the ultor voltage generating circuit. For example, such loading is dependent upon the brightness of the image being displayed on the kinescope. This variation in the timings of the horizontal retrace pulses, disadvantageously, may cause a distortion of the image being displayed.

To prevent the occurrence of a variation in a delay of the deflection current relative to the synchronizing signal, a dual feedback loop arrangement may be used. In such arrangement, a horizontal oscillator generates a signal at, for example, a frequency greater than the horizontal frequency. The oscillator generated signal is divided down in a frequency divider and an output signal near the horizontal frequency is generated. A PLL having a relatively long time constant controls the oscillator to maintain the output signal in frequency and phase synchronism with horizontal synchronizing signals. The frequency divider may be included in the PLL. In order to compensate for load-dependent variations in the delay of the horizontal deflection circuit output stage, a phase-control loop circuit (PCL) may be used. The PCL includes a phase detector, a first input terminal of which is coupled to an output of the PLL and a second input terminal of which is coupled to the deflection circuit output stage for responding to the retrace pulses. The phase detector produces a phase difference indicative signal from the signals at the first and second input terminals. A loop filter is coupled to an output of the phase detector to form a control signal. A controllable phase shifter is responsive to the control signal that is generated by the loop filter for producing horizontal-rate drive pulses at a variable delay which makes the retrace pulses synchronous with the output signal of the PLL even when variations of beam current loading occur.

In a circuit embodying the invention, the PCL requires, for its internal operation, timing signals at various multiple frequencies of the horizontal frequency that are at corresponding predetermined constant phases relative to the horizontal rate output signal of the PLL. It may be desirable to generate each of such timing signals from, for example, a signal that is generated in the PLL that is at a high multiple of the horizontal frequency.

In accordance with an aspect of the invention, a television apparatus includes a source of a synchronizing input signal at a frequency that is related to a deflection frequency. A first signal that is synchronized to the input signal is generated at a first terminal at a first frequency that is related to that of the input signal. First frequency dividing means responsive to the first signal generates at a second terminal a second signal at a second frequency that is related to the deflection frequency and that is lower than the first frequency. Second frequency dividing means responsive to the first signal generates a third signal at a frequency that is lower than the first frequency. A phase initialization signal that is coupled to the second frequency dividing means is generated. The phase initialization signal varies a phase of the third signal to correspond with that of the second signal to initialize the second frequency dividing means. The second and third signals are coupled to a utilization circuit. The utilization circuit requires for its proper operation the phase of the third signal to correspond with that of the second signal.

The sole FIGURE illustrates a phase-lock-loop circuit and a phase-control-loop circuit, embodying the invention, that control the phase of a deflection current in a deflection winding.

Horizontal sync pulses $S_H$ having a period H, that in NTSC is 63.5 microseconds, and having a corresponding frequency $f_H$ are coupled, illustratively, from a conventional sync separator of a television receiver, not shown in the FIGURE, to an input terminal 30a of a phase detector 30. A signal $O_H$ that during steady state operation is at the frequency $f_H$ is coupled via a capacitor $C_c$ to a second input terminal 30b of phase detector 30. A phase difference indicative signal PH that is indicative of the phase difference between signal $S_H$ and signal $O_H$ that is generated by phase detector 30 is coupled to a frequency control input terminal 31a of a voltage controlled oscillator 31. Oscillator 31 generates an output signal $O_{32H}$ at a frequency $32 \times f_H$. Signal $O_{32H}$ is frequency divided by 32 in a frequency divider 32 to produce signal $O_H$. Detector 30, oscillator 31 and frequency divider 32 form a phase-lock-loop circuit (PLL) 20 that may be included in a first integrated circuit 100 such as, for example, the Toshiba IC. The operation of PLL 20 causes signals $O_H$ and $O_{32H}$ to be synchronized with signal $S_H$.

A phase-control-loop (PCL) 30, having a control section that may be internal to a second integrated circuit 200, generates a signal $D_H$ at the frequency $f_H$. Signal $D_H$ is coupled via an inverter 133 to a horizontal driver 33 that generates a signal 33a that is coupled to a base electrode of a switching transistor Q1. Transistor Q1 is included in, for example, a conventional horizontal output stage 99. Output stage 99 produces, in a winding 34 of a flyback transformer T0, a retrace pulse at a high voltage that is used, in a high voltage supply 35, for generating an ultor voltage U. Voltage U is coupled to an ultor electrode of a cathode ray tube, not shown in the FIGURE, of the television receiver. PCL 30 is synchronized to signal $O_H$ in such a way that deflection current $i_Y$ in a deflection winding $L_Y$ is maintained in a constant phase relationship relative to signal $O_H$ despite varying beam current loading that loads winding 34 in a manner to be described in detail later on.

IC 200 includes a frequency dividing arrangement 45, embodying an aspect of the invention. Arrangement 45 includes a flip-flop 40 having a clock receiving terminal 40a that receives signal $O_{32H}$ that is at the frequency $32 \times f_H$. Flip-flop 40 generates an output signal $E_{16H}$ that toggles, or changes states, each time a clocking edge of signal $O_{32H}$ occurs. Signal $E_{16H}$ is at a frequency $16 \times f_H$ that is one-half of the frequency of signal $O_{32H}$. Flip-flop 40 forms the first stage in five-stage cascaded-coupled frequency dividing arrangement 45 that includes flip-flops 40–44. Note that none of the frequency dividing stages of arrangement 45 is in common with any stage of frequency divider 32. Arrangement 45 generates corresponding output signals $E_{16H}$, $E_{8H}$, $E_{4H}$, $E_{2H}$ and $E_H$ at frequencies $16 \times f_H$, $8 \times f_H$, $4 \times f_H$, $2 \times f_H$ and $f_H$, respectively, at corresponding output terminals of flip-flops 40–44.

In carrying out an aspect of the invention, horizontal rate signal $O_H$ is coupled via an "AND" gate 52 to a corresponding reset pulse receiving terminal RESET of each of flip-flops 40–44 for abruptly resetting the phase of each of signals $E_{16H}$, $E_{8H}$, $E_{4H}$, $E_{2H}$ and $E_H$ to insure that they conform to that of signal $O_H$. Resetting the phase of such signals is done by causing each of flip-flops 40–44 to assume abruptly a FALSE state when a leading edge $O_{Ha}$ of signal $O_H$ occurs, as described later on. In this way, flip-flops 40–44 are initialized. Initializing flip-flops 40–44 is required because flip-flops 40–44 are outside the feedback loop of PLL 20. The phase of each of the output signals of flip-flops 40–44, if flip-flops 40–44 were not initialized, disadvantageously, would not be predetermined. If the phase of the output signals of flip-flops 40–44 were not predetermined, PCL 30 would operate, disadvantageously, improperly.

A flip-flop 51 delays signal $O_H$ by approximately one microsecond to form a delayed signal 51a that is also inverted. The one microsecond delay time is caused by using, for clocking flip-flop 51, a transition edge of signal $O_{32H}$ that occurs between the transition edges used for clocking frequency divider 32. The delayed signal 51a that is coupled to an input terminal 52a of "AND" gate 52 disables gate 52 one microsecond after leading edge $O_{Ha}$ of signal $O_H$. Thus a pulse 50 is generated on a conductor 49 when both signals 51a and $O_H$ are simultaneously at corresponding TRUE state. Pulse 50 that has a duration of approximately one microsecond and that is at the horizontal rate $F_H$ is synchronized to signal $O_H$. When pulse 50 occurs, each of flip-flops 40–44 is initialized to provide the corresponding output signal at a corresponding predetermined state such as, for example, a FALSE state. Without the initialization operation performed by pulse 50, the phase of the signals at the output terminals of flip-flops 40–44, disadvantageously, would not have been predetermined.

Each of the output signals of flip-flops 40–44 is also periodic at the frequency $F_H$ of signal $O_H$ or 50. Therefore, if no significant phase perturbation in signals $O_H$ and $O_{32H}$ of PLL 20 occurs, once initialized by signal 50, each of the corresponding output signals of flip-flops 40–44 will remain, in each subsequent period H, in a corresponding constant phase relationship with respect to signal $O_H$. It should be understood that flip-flops 40–44, 51 and gate 52 are located outside the feedback loop of PLL 20.

In accordance with an aspect of the invention, by having signals $E_{16H}$, $E_{8H}$, $E_{4H}$, $E_{2H}$ and $E_H$ thus synchronized to signal $O_H$, these signals may be used to provide timing signals with edges that occur at predetermined instants during each period H of signal $O_H$. The resolution by which each such timing pulse or signal is provided is determined by the period of signal $O_{32H}$. A horizontal rate signal 36 produced at an output terminal 53a of a flip-flop 53 that is used for generating a sawtooth reference signal in PCL 30 is a representative example of such timing signals.

To generate signal 36, signals $E_{4H}$, $E_{2H}$ and $E_H$ are coupled to corresponding input terminals of an AND gate 54 that produces a signal 54a having the TRUE state when each of such signals is at the TRUE state simultaneously with the other ones. Signal 54a is coupled to a data input receiving terminal 53c of a flip-flop 53. Signal $E_{8H}$ is coupled to a clock input receiving terminal 53b of flip-flop 53. Flip-flop 53 delays signal 54a by an interval having a duration that is determined by signal $E_{8H}$ to form signal 36. Signal 36 is at the TRUE state during approximately 8 microseconds and at the FALSE state during the rest of period H. By means of gate 54 and flip-flop 53, signal 36 is delayed relative to signal $O_H$ by a predetermined delay of, for example, 4 microseconds that is determined by signals $E_{8H}$, $E_{4H}$, $E_{2H}$ and $E_H$. Signal 36 is used for controlling the timing of a ramp generator 37 of IC 200 that is used by PCL 30, as described below.

Ramp generator 37 generates a sawtooth signal 37a that is coupled to an input terminal 38a of a voltage comparator 38. Generator 37 includes a current source $i_{cs}$ that is coupled to a capacitor $C_{37}$ that may be external to IC 200. A switch 37b of generator 37 is coupled across capacitor $C_{37}$ for discharging capacitor $C_{37}$ and for maintaining, afterward, sawtooth signal 37a across capacitor $C_{37}$ at a constant level as long as horizontal rate control signal 36 is at the TRUE state. When signal 36 is at the FALSE state, current source $i_{cs}$ charges capacitor $C_{37}$ to form an upramping portion 37c of signal 37a.

Signal $O_H$ is also coupled via a flip-flop 39 to an input terminal 57a of a second phase detector 57. Flip-flop 39 is clocked by signal $E_{8H}$ to provide a delayed signal $39a$ that is delayed relative to signal $O_H$ by approximately 4 microseconds. The purpose of utilizing the 4 microsecond delay is to compensate for various delays in PCL 30 such as in a network 58 that is discussed below. A signal $F_H$, developed in a winding 136 of flyback transformer T0, is coupled via delay and pulse shaping network 58, that was mentioned before, to a second input terminal 57b of phase detector 57. Signal $F_H$ is indicative of the phase of deflection current $i_y$ in deflection winding $L_Y$. An output signal 59 of detector 57 that is indicative of the phase difference between signal $39a$ and signal $F_H$ is coupled via low-pass filter 66 to form a control signal $66a$ at a second input terminal 38b of comparator 38.

When, during a given period H, ramping portion 37b of signal 37a becomes greater than signal $66a$ at terminal 38b of comparator 38, comparator 38 generates a signal transition edge of an output signal 60 that is coupled to a triggering input terminal $61a$ of a one-shot flip-flop 61. Flip-flop 61 then generates a pulse $D_{Ha}$ having, illustratively, a constant duration that is coupled to horizontal driver 33 to cause transistor Q1 to become nonconductive, for example. Comparator 38 varies a phase of pulse $D_{Ha}$ relative to that of signal $O_H$ in such a manner that signal $F_H$ will have a constant phase relationship relative to signal $O_H$. Thus, a change in the ultor loading at a terminal $35a$ of a high voltage supply 35 that tends to cause a change in the phase of signal $F_H$, will cause a corresponding change control signal 66 that will vary the phase in the delay of pulse $D_H$ in a negative feedback manner. The change in the phase of pulse $D_{Ha}$ will maintain the phase of signal $F_H$ and of deflection current $i_y$ constant relative to signal $O_H$ despite the change in phase of signal $F_H$.

The tracking response time, in PCL 30 with respect to phase variations of retrace signal $F_H$ is faster than the corresponding tracking response in PLL 20 with respect to phase variations of synchronizing input signal $S_H$. This is so, because PCL 30 is optimized to accommodate fast switching time variations in output stage 99 that may occur because of fast changing electron beam current; whereas, PLL 20 is optimized to reject noise or jitter accompanying the sync pulses in signal $S_H$.

Thus, frequency dividing arrangement 45 that is located outside the feedback loop of PLL 20 generates timing signals that are maintained in phase with signal $O_H$, generated by frequency divider 32. As indicated before, frequency divider 32 is included in the feedback loop of PLL 20. Maintaining the phase of the timing signals of arrangement 45 is accomplished, in accordance with an aspect of the invention, by utilizing pulse 50 that initializes flip-flops 40–44 of arrangement 45.

What is claimed:

1. A television apparatus, comprising:
   a source of a synchronizing input signal at a frequency that is related to a deflection frequency;
   means responsive to said input signal for generating at a first terminal a first signal that is synchronized to said input signal at a first frequency that is related to that of said input signal;
   first frequency dividing means responsive to said first signal for generating at a second terminal a second signal at a second frequency that is related to said deflection frequency and that is lower than said first frequency;
   second frequency dividing means responsive to said first signal for generating a third signal at a frequency that is lower than said first frequency;
   means responsive to said second signal for generating a phase initialization signal that is coupled to said second frequency dividing means for varying a phase of said third signal to correspond with that of said second signal to initialize said second frequency dividing means; and
   a utilization circuit responsive to said second and third signals, said utilization circuit requiring, for its proper operation, said phase of said third signal to correspond with that of said second signal.

2. An apparatus according to claim 1 wherein said first and second signals are generated in a phase-lock-loop circuit such that each of said first and second signals is synchronized to said input signal.

3. An apparatus according to claim 2 wherein said phase-lock-loop circuit is included in a first integrated circuit and wherein said second frequency dividing means is located outside said first integrated circuit.

4. An apparatus according to claim 2 further comprising, a phase-control-loop circuit responsive to said third signal for generating a control signal at a controllable phase, wherein said utilization circuit comprises a deflection circuit output stage that is responsive to said control signal, said output stage generating a deflection cycle indicative signal that is indicative of a phase of a deflection current in a deflection winding, said deflection cycle indicative signal being coupled to a phase detector of said phase-control-loop circuit that varies a phase of said control signal in accordance with a phase difference between said deflection cycle indicative signal and said second signal.

5. An apparatus according to claim 4 further comprising, means responsive to said third signal for generating a sawtooth waveform that is synchronized to said third signal and a comparator responsive to said sawtooth waveform and to an output signal of said phase detector for generating said control signal when said sawtooth waveform is at a level that corresponds with that of said output signal of said phase detector.

6. An apparatus according to claim 2 wherein a feedback loop signal path of said phase-lock-loop circuit includes said first frequency dividing means and wherein said second frequency dividing means is located outside said feedback loop signal path of said phase-lock-loop circuit.

7. An apparatus according to claim 1 wherein said phase initialization signal generating means comprises means responsive to said first signal for delaying said second signal in accordance with said first signal to generate a delayed signal and means responsive to said undelayed second and delayed signals for generating therefrom said phase initialization signal.

8. An apparatus according to claim 7 wherein said second signal delaying means comprises a flip-flop having a clock receiving terminal that is coupled to said first signal, an input terminal that is coupled to said second signal and an output terminal where said delaying signal is generated, wherein said delayed signal at said output terminal of said flip-flop and said second signal are coupled to corresponding input terminals of a gate that generates said phase synchronization signal at an output terminal of said gate.

9. An apparatus according to claim 1 wherein said first signal is coupled to a clock receiving terminal of said second frequency dividing means that has at least a frequency dividing stage and wherein said phase initialization signal is coupled to a second input terminal of said second frequency dividing means to initialize abruptly each frequency dividing stage of said second frequency dividing means to a corresponding predetermined state when said phase initialization signal occurs.

10. An apparatus according to claim 1 wherein said second frequency dividing means includes at least a frequency dividing stage that is initialized by said third signal such that said frequency dividing stage is located outside said first frequency dividing means.

11. An apparatus according to claim 1 wherein said phase initialization signal causes a phase difference between said third and second signals to remain constant irrespective of a phase variation that occurs in said input signal.

12. A television deflection apparatus, comprising:
   a source of a synchronizing input signal at a frequency that is related to a deflection frequency;
   a phase-lock-loop circuit responsive to said input signal for generating first and second signals at different frequencies that are, each, related to said deflection frequency;
   frequency dividing means responsive to said second signal for generating a third signal at a frequency that is related to, and that is lower than that of said second signal;
   phase initialization means responsive to said first signal for generating a phase initialization signal that is coupled to said frequency dividing means to initialize a phase of said third signal such that, once initialized, said phase of said third signal remains invariant relative to that of said first signal;
   a ramp generator responsive to said third signal for generating a ramp signal having a sawtooth waveform at a phase that is determined by said phase of said third signal;
   a deflection circuit output stage responsive to a control signal for generating a deflection current in a deflection winding at a phase that is determined by a phase of said control signal and for generating a phase indicative signal that is indicative of said phase of said deflection current;
   a phase detector responsive to said first signal and to said phase indicative signal for generating a phase difference indicative signal in accordance with a phase difference between said phase indicative signal and said first signal; and
   phase shifting means responsive to said phase difference signal and to said ramp signal for generating said control signal having said phase that varies in accordance with said phase difference signal and a frequency that is determined by said ramp signal.

13. An apparatus according to claim 12 wherein said first signal is at a horizontal frequency.

14. An apparatus according to claim 12 wherein, once initialized, said frequency dividing means maintains said phase of said third signal the same relative to that of said first signal if any of said phases of said phase indicative and input signals changes.

15. An apparatus according to claim 12 wherein said frequency dividing means comprises a chain of frequency dividing stages having, each, a corresponding terminal that is coupled to said phase initialization signal such that each of said stages is initialized simultaneously with the other ones to a corresponding predetermined state when said phase initialization signal occurs.

16. An apparatus according to claim 12 wherein said phase-lock-loop circuit is included in an integrated circuit and wherein said frequency dividing means is located outside said integrated circuit.

17. A television deflection apparatus, comprising:
   a source of a synchronizing input signal at a frequency that is related to a deflection frequency;
   a controllable oscillator for generating a first signal at a frequency that is related to that of said input signal;
   a first frequency divider responsive to said first signal for generating a second signal at a frequency that is related to, and that is lower than that of said first signal;
   a first phase detector responsive to said input and second signals for generating a phase difference indicative signal that is coupled to said controllable oscillator to synchronize said first and second signal to said input signal such that said first phase detector, said oscillator and said first frequency divider form a feedback loop signal path of a phase-lock-loop circuit;
   a second frequency divider responsive to said first signal and located outside said feedback loop signal path of said first phase-lock-loop circuit for generating a third signal at a frequency that is related to, and that is lower than that of said first signal;
   a deflection circuit output stage responsive to a fourth signal at a frequency that corresponds with that of said input signal for generating a deflection current in a deflection winding and for generating a signal that is indicative of a phase of said deflection current;
   a second phase detector responsive to said phase indicative signal and to said second signal for generating a phase difference indicative signal that is indicative of a phase difference between said second and said phase indicative signals; and
   means responsive to said third and to said phase difference indicative signals for generating said fourth signal having a frequency that is determined by that of said third signal and a phase that is determined by said phase difference indicative signal such that said second phase detector, said output stage and said fourth signal generating means form a phase-control-loop circuit.

* * * * *